(12) United States Patent
Wang et al.

(10) Patent No.: US 8,514,024 B2
(45) Date of Patent: Aug. 20, 2013

(54) HIGH POWER-SUPPLY REJECTION RATIO AMPLIFYING CIRCUIT

(75) Inventors: Rui Wang, Chengdu (CN); Jinyan Lin, Hangzhou (CN); Huijie Zhao, Hangzhou (CN); Yunping Lang, Hangzhou (CN)

(73) Assignee: Chengdu Monolithic Power Systems Co., Ltd., Chengdu (CN)

( * ) Notice: Subject to any disclaimer, the term of this patent is extended or adjusted under 35 U.S.C. 154(b) by 81 days.

(21) Appl. No.: 13/218,370

(22) Filed: Aug. 25, 2011

(65) Prior Publication Data

US 2012/0049959 A1 Mar. 1, 2012

(30) Foreign Application Priority Data

Aug. 26, 2010 (CN) .......................... 2010 1 0268553

(51) Int. Cl.
*H03F 3/04* (2006.01)
(52) U.S. Cl.
USPC .......................................... 330/297; 330/285
(58) Field of Classification Search
USPC ......................................... 330/297, 285, 296
See application file for complete search history.

(56) References Cited

U.S. PATENT DOCUMENTS

| | | | |
|---|---|---|---|
| 5,289,137 A | 2/1994 | Nodar et al. | |
| 7,061,327 B2 | 6/2006 | Doy | |
| 7,382,195 B2 * | 6/2008 | Chen et al. | 330/297 |
| 7,417,503 B2 | 8/2008 | Xu et al. | |
| 7,554,408 B2 | 6/2009 | Chen et al. | |
| 7,609,114 B2 * | 10/2009 | Hsieh et al. | 330/297 |
| 7,714,661 B2 | 5/2010 | Doy et al. | |
| 7,782,141 B2 * | 8/2010 | Witmer et al. | 330/297 |
| 7,994,864 B2 * | 8/2011 | Chen et al. | 330/297 |
| 8,068,622 B2 * | 11/2011 | Melanson et al. | 381/120 |
| 8,310,313 B2 * | 11/2012 | Guo et al. | 330/297 |
| 2005/0077950 A1 | 4/2005 | Robinson | |
| 2008/0197907 A1 * | 8/2008 | Wang | 327/333 |
| 2011/0123048 A1 | 5/2011 | Wang et al. | |

* cited by examiner

*Primary Examiner* — Henry Choe
(74) *Attorney, Agent, or Firm* — Perkins Coie LLP

(57) ABSTRACT

The embodiments of the present invention disclose a high power-supply rejection ratio (PSRR) amplifier circuit. The amplifier circuit comprises a low dropout regulator, a negative charge pump and an amplifier. The output voltages of the negative charge pump and the low dropout regulators don't track the change of input voltage. Therefore the amplifier circuit has high PSRR.

13 Claims, 4 Drawing Sheets

HIGH POWER-SUPPLY REJECTION RATIO AMPLIFYING CIRCUIT

CROSS-REFERENCE TO RELATED APPLICATIONS

This application claims priority to and the benefit of Chinese patent application No. 201010268553.7, filed on Aug. 26, 2010, which is incorporated herein by reference in its entirety.

TECHNICAL FIELD

The present invention relates to amplifiers, and more particular but not exclusive to amplifiers with high power-supply rejection ratio (PSRR).

BACKGROUND

Amplifier is configured to convert a low power signal to a high power signal, and it is desired to have high quality and low total harmonic distortion (THD).

Generally, an amplifier is powered by a positive power supply and a system ground (zero voltage). The output voltage of the amplifier is only allowed to oscillate between the zero voltage and the positive power supply voltage. It turns out that the output end of the amplifier could not be biased to the system ground when the load of the amplifier is coupled to the system ground. As a result, a large static current exists in the path from the output end of the amplifier to the system ground. This static current may lower the efficiency of the amplifier and short the lifetime of the load.

In order to bias the output end of the amplifier to the system ground, in the amplifier circuit, a negative charge pump may be utilized and configured to generate a negative voltage (taking the system ground as zero reference) as the lowest power supply voltage instead of the system ground. The output voltage of the amplifier is oscillated between the positive power supply voltage and this negative voltage so that it is easy to bias the amplifier to the system ground. Unfortunately, the negative charge pump enlarges the voltage drop on the amplifier. Even in low power occasion, it is difficult to fabricate this type of amplifier through a low voltage low cost semiconductor process. For example, if the amplifier is utilized at cell phone charger, since the maximum voltage of the Li-on battery is 4.2V, the voltage drop on the amplifier may be larger than 8V. The amplifier with such large voltage drop may be difficult to fabricate. Even being fabricated, it may have a relative high cost.

For reducing the voltage drop on the amplifier, low dropout regulator (LDO) may apply in the amplifier circuit. The LDO receives the positive power supply voltage and provides a relative low positive voltage to the amplifier. Therefore the voltage drop becomes lower and the amplifier is easy to fabricate.

However, for conventional charge pump, its output voltage may tend to be affected by the input voltage. When the input voltage changes, the output voltage changes correspondingly which makes the output of the amplifier unstable and the PSRR worse.

BRIEF SUMMARY

In one embodiment, an amplifier circuit comprises a low dropout regulator, a negative charge pump and an amplifier. Wherein the low dropout regulator is coupled to a first reference voltage and a first input voltage, operable to generate a first output voltage; the negative charge pump is coupled to a second reference voltage and a second input voltage, operable to generate a second output voltage; and wherein the first output voltage is coupled to a positive power supply end of the amplifier, and wherein the second output voltage is coupled to a negative power supply end of the amplifier.

BRIEF DESCRIPTION OF THE DRAWINGS

Non-limiting and non-exhaustive embodiments are described with reference to the following drawings. The drawings are only for illustration purpose.

The use of the same reference label in different drawings indicates the same or like components.

DETAIL DESCRIPTION

The following description and discussion about specific embodiments of the present invention is for purposes of illustration. However, one with ordinary skill in the relevant art should know that the invention is not limited by the specific examples disclosed herein. Variations and modifications can be made on the apparatus, methods and technical design described above. Accordingly, the invention should be viewed as limited solely by the scope and spirit of the appended claims.

Figure 1:
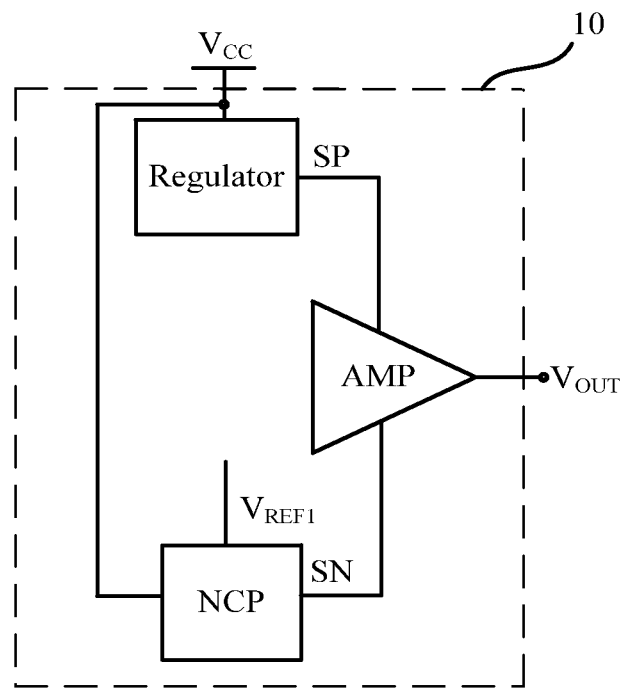
FIG. 1 illustrates a high PSRR amplifier circuit 10 according to an embodiment of the present invention.

FIG. 1 illustrates a high PSRR amplifier circuit 10 according to an embodiment of the present invention. As shown in FIG. 1, in the amplifier circuit 10, a regulator receives a power supply voltage Vcc, configured to generate a positive voltage SP as a first output voltage. A negative charge pump NCP also receives the power supply voltage Vcc and a first reference voltage $V_{REF1}$ configured to generate a negative voltage SN as a second output voltage. An amplifier AMP receives voltages SP and SN, and generates an output voltage $V_{OUT}$ of the amplifier.

The negative charge pump NCP generates the negative voltage SN according to the power supply voltage Vcc. In an embodiment, the absolute value of the negative voltage SN may equal the positive voltage SP, −SN=SP. In other embodiments, the absolute value of the negative voltage SN may be unequal to the positive voltage SP, −SN≠SP. Voltages SP and SN is utilized as a maximum power supply voltage and a minimum power supply voltage respectively provided to the amplifier AMP.

In the illustrated embodiment, the negative charge pump NCP is coupled to the power supply voltage Vcc. However, one with ordinary skill in relevant art should understand that in other embodiment, the negative charge pump may be powered by the positive voltage SP or an external power supply.

Figure 2:
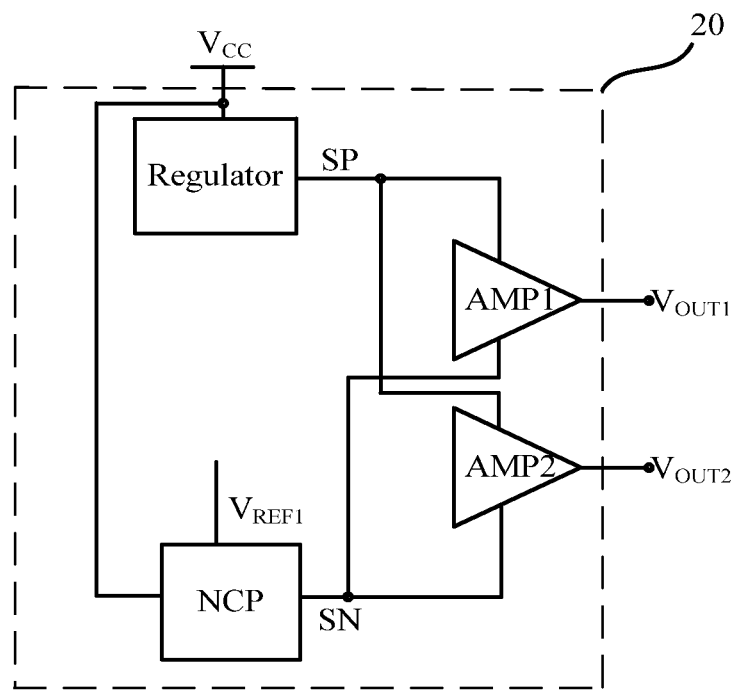
FIG. 2 illustrates another high PSRR amplifier circuit 20 according to another embodiment of the present invention.

FIG. 2 is a high PSRR amplifier circuit 20 according to another embodiment of the present invention. Compared with the embodiment shown in FIG. 1, the high amplifier circuit 20 comprises two amplifiers. Seen in FIG. 2, the positive voltage SP generated by the regulator is provided to amplifiers AMP1 and AMP2 as the maximum power supply voltage. The negative voltage SN generated by the NCP is provided to amplifiers AMP1 and AMP2 as the minimum power supply voltage. Amplifiers AMP1 and AMP2 generate output voltages Vout1 and Vout2 respectively. One with ordinary skill in relevant art should understand that in other embodiments, the positive voltage SP from the regulator and the negative voltage from NCP may be provided to a plurality of amplifiers for adapting different occasions.

Figure 3:
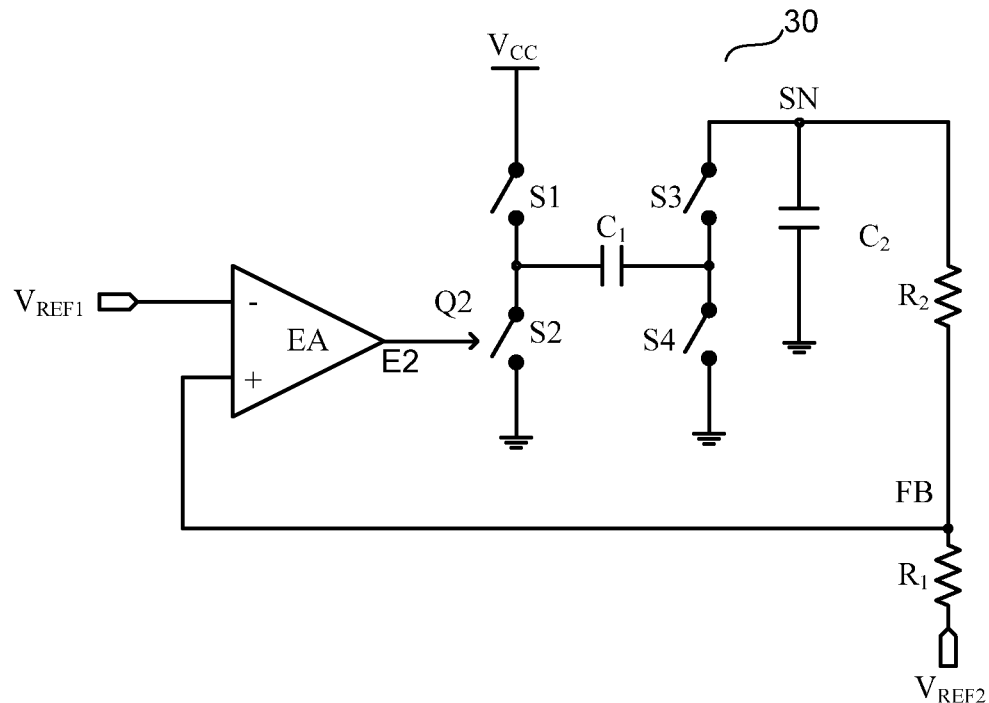
FIG. 3 illustrates a schematic circuitry of a negative charge pump NCP 30 shown in FIG. 1 and FIG. 2 according to an embodiment of the present invention.

FIG. 3 illustrates a schematic circuitry of negative charge pump NCP 30 shown in FIG. 1 and FIG. 2 according an embodiment of the present invention. Referring to FIG. 3, the negative charge pump NCP 30 comprises a first series-coupled switch pair S1 and S2, a seocnd series-coupled switch pair S3 and S4, a first capacitor C1, a second capacitor C2 and a feedback loop. The first series-coupled switch pair S1 and S2 is connected between the input voltage Vcc and system ground. The seocnd series-coupled switch pair S3 and S4 is connected between an output end of the negative charge pump NCP 30 and system ground. For each switch pair, the two switches have a common end. A first capacitor C1 is coupled between the common end of the first switch pair, and the common end of the second switch pair. A second capacitor C2 is coupled between the output end of the negative charge pump NCP 30 and system ground. The output end provides the negative voltage SN. The feedback loop comprises a sampling circuit and an error amplifier. In the shown embodiment, the sampling circuit is a voltage divider comprising resistors R1 and R2, wherein the voltage divider is coupled between the output end of the negative charge pump NCP 30 and a second reference voltage $V_{REF2}$. And the common end of resistors R1 and R2 comprises the output end FB of the sampling circuit. A positive input end of an error amplifier EA is coupled to the output FB of the sampling circuit (R1, R2). While a negative input end of the error amplifier EA is coupled to the first reference voltage $V_{REF1}$. The error amplifier EA provides a regulating signal E2 to control the switch S2. In other embodiments, the error amplifier EA may control the switch S2 by way of controlling other suitable device. For example, a buffer circuit may be coupled to the output end of the error amplifier EA to receive the regulating signal E2 and configured to generate an output signal to control the switch S2. Further logic circuit or driver circuit may be applied to receive the regulating signal E2 and regulate the second switch.S2

For the illustrated embodiment, at a first period T1, in negative charge pump NCP 30, switches S1 and S4 turn on while switches S2 and S3 turn off. The power supply voltage Vcc charges the capacitor C1. At a second period T2, switches S1 and S4 turn off while switches S2 and S3 turn on. Moreover, the switch S2 is controlled by the regulating signal E2 from the error amplifier EA, configured to be a voltage-controlled current source or a voltage-controlled resistor. Thus, the capacitor C1 charges capacitor C2 at period T2 and the charging current is controlled by the regulating signal E2 from the error amplifier EA.

The divider comprising resistors R1 and R2 detects the negative voltage SN and generates a sample voltage accordingly. The divider and the error amplifier EA together comprise a closed feedback loop. When the negative voltage SN excesses a predetermined value, the error between the sample voltage and the second reference voltage is increased. Then a larger regulating signal E2 is generated by the error amplifier EA configure to reduce the on-state resistance of switch S2 or to increase the charge current. Thus the negative voltage SN falls off. When the negative voltage SN falls off to the predetermined value, the capacitor C1 stops charging the capacitor C2 to maintain the negative voltage to the predetermined value. Through the regulating of the closed feedback loop, the negative voltage SN generated by the NCP 30 is:

$$SN = \frac{R_1 + R_2}{R_1} \times V_{REF1} - \frac{R_2}{R_1} \times V_{REF2}$$

As seen above, the NCP generates a constant negative voltage SN through the control of switch S2. The negative voltage SN relates to the resistor R1, R2 and reference voltages $V_{REF1}$ and $V_{REF2}$. In other embodiment, the voltage divider may be coupled to the system ground instead of the second reference voltage $V_{REF2}$ and the negative voltage SN relates to the resistor R1, R2 and the first reference voltage $V_{REF1}$. The negative voltage SN is regulated by the regulating voltage and is independent on the input voltage Vcc. And no change may occur on the negative voltage SN when the input voltage Vcc is changed. Therefore, high PSRR is achieved on the amplifier circuit.

Figure 4:
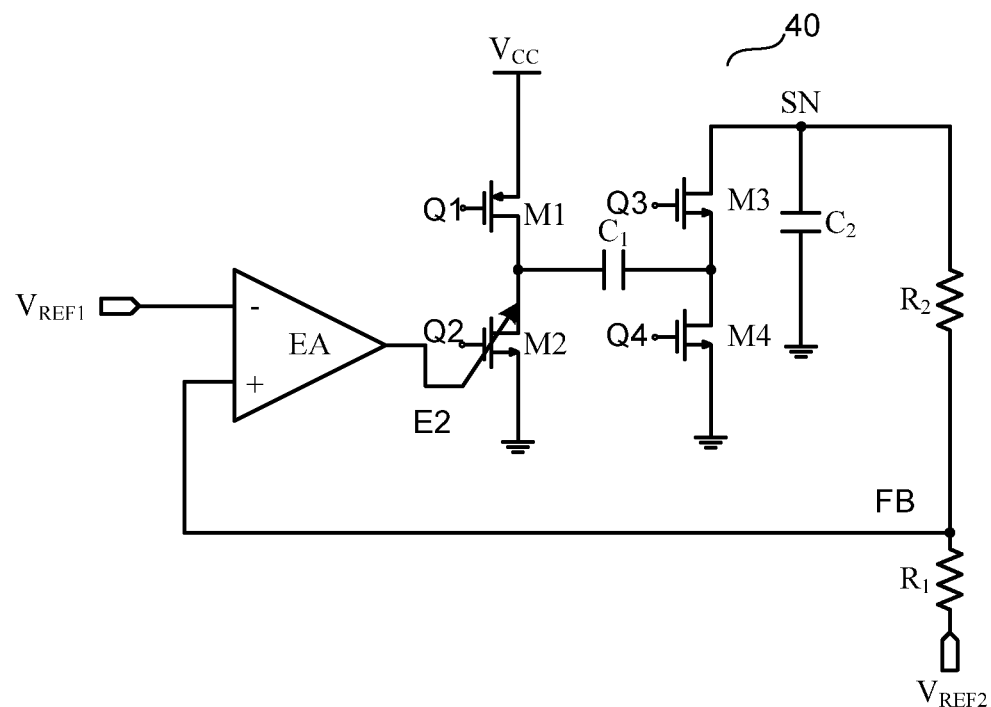
FIG. 4 illustrates a negative charge pump 40 utilizing metal-oxide semiconductor field effect transistors (MOSFET) as the switches shown in FIG. 3 according to an embodiment of the present invention.

FIG. 4 illustrates a specific NCP circuit 40 with metal-oxide semiconductor field effect transistor (MOSFET) as the switches in FIG. 3 according to an embodiment of the present invention. As depicted in FIG. 4, a P-type MOSFET M1 and N-type MOSFETs M2, M3 and M4 are corresponding to switches S1, S2, S3 and S4 shown in FIG. 3. The gate of MOSFETs M1, M2, M3 and M4 are controlled by control signals Q1, Q2, Q3 and Q4 respectively.

Figure 5:
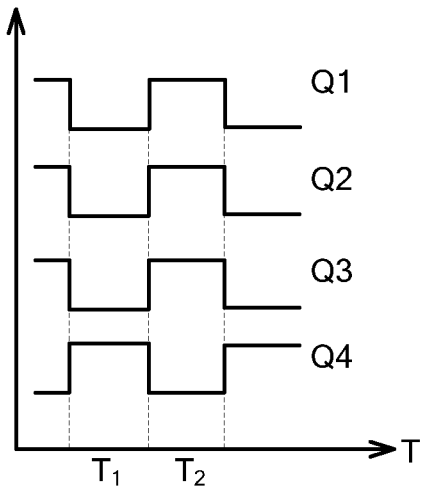
FIG. 5 illustrates a waveform diagram of control signals for controlling the MOSFETs shown in FIG. 4 according to an embodiment of the present invention.

FIG. 5 illustrates an operational waveform diagram of control signals Q1, Q2, Q3 and Q4 according to an embodiment of the present invention. At the first period T1, control signals Q1, Q2 and Q3 are at low level while Q4 is at high level. As a result, MOSFETs M1 and M4 turn on while M2 and M3 turn off. The power supply voltage Vcc charges the capacitor C1. At the second period T2, control signals Q1, Q2, and Q3 are at high level while Q4 is at low level. So MOSFETs M1 and M4 turn off while M2 and M3 turn on. The error amplifier EA provides the regulating signal E2 to regulate the on-state resistance of MOSFET M2, and the capacitor C1 charges the capacitor C2.

One with ordinary skill in relevant art should understand that the MOSFETs M1, M2, M3 and M4 shown in FIG. 4 and the control signals Q1, Q2, Q3 and Q4 are for illustrative purpose only. In other embodiments, M1, M2, M3 and M4 may have alternative conductivity type and the waveform of control signals Q1, Q2, Q3 and Q4 may be different from they shown in FIG. 5. Also in these embodiments, through the control of Q1, Q2, Q3 and Q4, at the first period T1, M1 and M4 turn on while M2 and M3 turn off; at the second period T2, M1 and M4 turn off while M2 and M3 turn on. One with ordinary skill in relevant art should also understand that in other embodiment, the switches S1, S2, S3 and S4 may be bipolar junction transistor (BJT), junction-type field effect transistor (JFET) or other suitable switch device with similar function.

Figure 6:
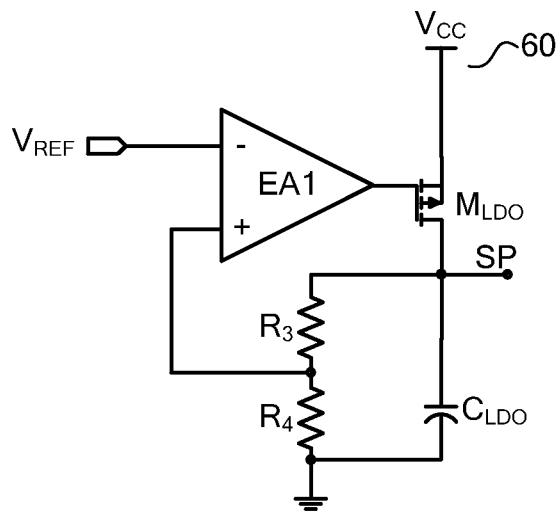
FIG. 6 illustrates a schematic circuitry of a regulator 60 shown in FIG. 1 and FIG. 2 according to an embodiment of the present invention.

FIG. 6 illustrates a schematic circuitry of regulator circuitry 60 that is shown in FIG. 1 and FIG. 2 according to an embodiment of the present invention. As seen in FIG. 6, regulator circuitry 60 is a low dropout regulator (LDO) and the LDO is a P-type low dropout regulator (PLDO). In LDO 60, a drain of a PMOS MLDO is coupled to the power supply voltage Vcc. A source of the PMOS MLDO provides the positive voltage SP. One end of a capacitor CLDO is coupled to the source, and the other end of the capacitor CLDO is connected to system ground. Resistors R3 and R4 comprises a voltage divider coupled between the source of the PMOS MLDO and system ground. The common end of resistor R3 and R4 is further coupled to a positive input end of an error amplifier EA1. A negative input end of the error amplifier EA1 receives a reference voltage $V_{REF}$ and an output end of the error amplifier EA1 is coupled to the gate of the PMOS MLDO.

The voltage divider comprising resistors R3 and R4 detects the generated positive voltage SP, and provides a sample voltage to the positive input end of the error amplifier EA1. The divider and the amplifier EA1 together comprise a feedback loop to regulate the positive voltage SP. When the positive voltage SP falls down, the error between the sample voltage and the first reference voltage $V_{REF}$ also falls down. The error amplifier EA1 output a lower driving voltage configured to reduce the voltage drop on M1. Therefore the positive voltage SP rises up. The positive voltage SP regulated by the feedback loop is:

$$SP = \left(\frac{R_3}{R_4} + 1\right)V_{REF}$$

As seen above, the positive voltage SP is determined by the resistance ratio $$\frac{R_3}{R_4}$$

of resistors R3 and R4, and by the reference voltage $V_{REF1}$, but doesn't tracks the change of the power supply voltage Vcc. As a result, high PSRR is achieved. Moreover, by changing the resistance ratio of the resistors R3 and R4, the positive voltage may be regulated flexibly.

Because of utilizing the closed-loop NCP and the regulator with stable output voltage, the new type of amplifier according to some embodiments of the present invention may be high efficiency, low cost and simple fabrication process. Moreover, the output voltage of the amplifier doesn't track the change of the power supply voltage so that the amplifier has high PSRR.

Figure 7:
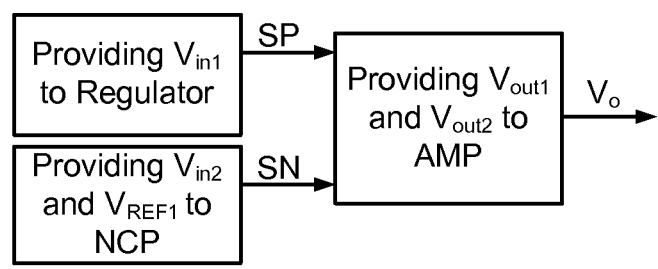
FIG. 7 illustrates a process flow for amplifying a signal according to an embodiment of the present invention.

FIG. 7 illustrates a process flow of amplifying a signal according to an embodiment of the present invention. Referring to FIG. 7, a system provides a first input voltage $V_{in1}$ to a regulator, configured to generate a positive voltage SP. While the system also provides a second input voltage $V_{in2}$ and a first reference voltage $V_{REF1}$ to a negative charge pump NCP, configured to generate a negative voltage SN. An amplifier AMP receives the positive voltage SP and the negative voltage SN as power supply voltage, and generates an amplified output voltage Vo. The first input voltage $V_{in1}$ and the second input voltage $V_{in2}$ may be the same or different from each other. Also, either the absolute values of the positive voltage SP may equal it of the negative voltage SN or not. In the illustrated embodiment, the positive voltage SP is independent with the first input voltage $V_{in1}$, while the negative voltage SN is independent with the second input voltage $V_{in2}$. Therefore, amplifying a signal according to the method in the illustrated embodiment could have a high PSRR.

Figure 8:
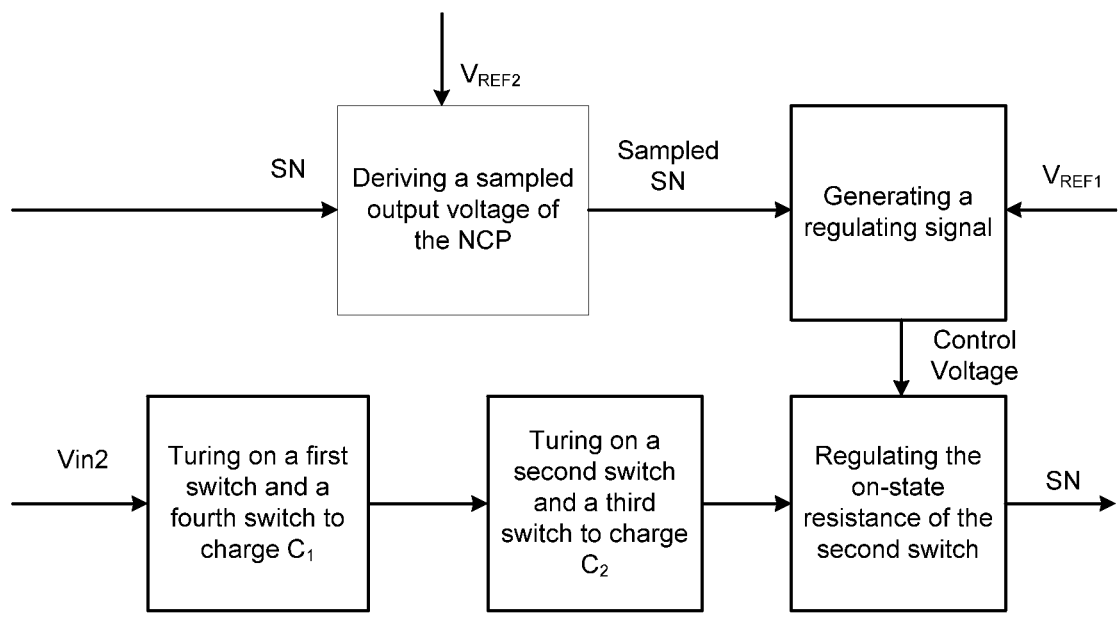
FIG. 8 illustrates a process flow for generating a negative voltage according to an embodiment of the present invention.

FIG. 8 illustrates a process flow of generating the negative voltage SN according to an embodiment of the present invention. As seen in FIG. 8, the negative charge pump derives a sampled output voltage. In certain embodiments, the sampled output voltage may be derived from the output voltage and a second reference voltage $V_{REF2}$. An error amplifier generating a regulating signal according to the sampled output voltage and the first reference voltage $V_{REF1}$. The second input voltage is coupled to a first capacitor to charge it when a first switch and a fourth switch is closed. Then, the first witch and the fourth switch turn off and a second switch and a third switch turn on. The charged first capacitor is coupled to a second capacitor. Therefore the second capacitor is charged by the first capacitor. The voltage over the second capacitor serves as the output voltage. When the second switch turns on, the regulating signal is utilized to regulate the on-state resistance of the second switch, or the charging current of the second capacitor. As a result, the output voltage is maintained at a constant value and is independent on the second input voltage.

The above description and discussion about specific embodiments of the present invention is for purposes of illustration. However, one with ordinary skill in the relevant art should know that the invention is not limited by the specific examples disclosed herein. Variations and modifications can be made on the apparatus, methods and technical design described above. Accordingly, the invention should be viewed as limited solely by the scope and spirit of the appended claims.

We claim:

1. An amplifier circuit, comprising:
a regulator, coupled to a first input voltage, operable to generate a first output voltage;
a negative charge pump, coupled to a first reference voltage and a second input voltage, operable to generate a second output voltage, wherein the negative charge pump comprises a feedback loop, sampling the second output voltage and receiving the first reference voltage, configured to generate a regulating signal to regulate the second output voltage; and
an amplifier, wherein the first output voltage is coupled to a positive power supply end of the amplifier, and wherein the second output voltage is coupled to a negative power supply end of the amplifier.

2. The amplifier circuit according to claim 1, further comprises a second amplifier, wherein the first output voltage is further coupled to a positive power supply end of the second amplifier, and wherein the second output voltage is further coupled to a negative power supply end of the second amplifier.

3. The amplifier circuit according to claim 1, wherein the first input voltage equals the second input voltage.

4. The amplifier circuit according to claim 1, wherein the first output voltage is positive and the second output voltage is negative, and wherein the absolute value of the first output voltage equals the absolute value of the second output voltage.

5. The amplifier circuit according to claim 1, wherein the negative charge pump further comprises:
a first series-coupled switch pair, comprising a first switch and a second switch, wherein the first switch and the second switch have a common end, and wherein the first switch pair is coupled between an input voltage and a system ground;

a second series-coupled switch pair, comprising a third switch and a fourth switch, wherein the third switch and the fourth switch have a common end, and wherein the second switch pair is coupled between an output end of the charge pump and the system ground;

a first capacitor, coupled between the common end of the first switch pair and the common end of the second switch pair; and a second capacitor, coupled between the output end of the charge pump and the system ground.

6. The amplifier circuit according to claim 5, wherein the first switch is a P-type metal-oxide semiconductor field effect transistor, and wherein the second switch, the third switch and the fourth switch are N-type metal-oxide semiconductor field effect transistor.

7. The amplifier circuit according to claim 5, wherein the first switch, the second switch and the third switch are controlled by a first control signal, and wherein the fourth switch is controlled by a second control signal, and wherein the second control signal is a complementary signal of the first control signal.

8. The amplifier circuit according to claim 1, wherein the feedback loop comprises:
    a sampling circuit, having an input coupled to the output end of the charge pump, and having an output; and
    an error amplifier, having a positive input end, a negative input end and an output end, wherein the positive input end is coupled to the output end of the sampling circuit, wherein the negative input end is coupled to the second reference voltage, and wherein the output end is configured to provide the regulating signal.

9. The amplifier circuit according to claim 8, wherein the sampling circuit is a voltage divider comprising a first resistor and a second resistor, wherein the voltage divider is coupled between the output end of the charge pump and a second reference voltage, and wherein the common end of the first resistor and the second resistor comprises the output end of the sampling circuit.

10. A method for supplying power to an amplifier, comprising:
    generating a first output voltage from a first input voltage;
    generating a second output voltage from a second input voltage and a first reference voltage; and
    providing the first output voltage to a positive power supply of an amplifier and providing the second output voltage to a negative power supply of the amplifier;
    wherein the second output voltage is regulated by
        deriving a sampled output voltage of the second output voltage to generate a regulating signal according to the sampled output voltage and the first reference voltage, and
        utilizing the regulating signal to regulate the second output voltage.

11. The method for supplying power to an amplifier according to claim 10, wherein the first input voltage equals the second input voltage, and wherein the absolute value of the first output voltage equals the absolute value of the second output voltage.

12. The method for supplying power to an amplifier according to claim 10, wherein the sampled output voltage is derived from the second output voltage and a second reference voltage.

13. The method for supplying power to an amplifier according to claim 10, wherein utilizing the regulating signal to regulate the second output voltage further comprises:
    turning on a first switch and a fourth switch to couple a first capacitor to the second input voltage;
    turning off the first switch and the fourth switch and turning on a second switch and a third switch to couple the first capacitor to a second capacitor; and
    regulating the on-state resistance of the second switch by the regulating signal;
    wherein the second capacitor provides the second output voltage.

* * * * *